US007480184B2

(12) United States Patent
Lam (10) Patent No.: US 7,480,184 B2
(45) Date of Patent: Jan. 20, 2009

(54) MAXIMUM LIKELIHOOD STATISTICAL METHOD OF OPERATIONS FOR MULTI-BIT SEMICONDUCTOR MEMORY

(75) Inventor: Chung H. Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 187 days.

(21) Appl. No.: 11/620,704

(22) Filed: Jan. 7, 2007

(65) Prior Publication Data

US 2008/0165595 A1 Jul. 10, 2008

(51) Int. Cl.
G11C 11/34 (2006.01)
G11C 16/04 (2006.01)

(52) U.S. Cl. .............................. 365/185.24; 365/185.03

(58) Field of Classification Search ............ 365/185.03, 365/185.24
See application file for complete search history.

(56) References Cited

U.S. PATENT DOCUMENTS

| 5,043,940 | A | 8/1991 | Harari .................... 365/185.03 |
| 6,469,931 | B1 | 10/2002 | Ban et al. ............... 365/185.08 |
| 7,023,735 | B2 | 4/2006 | Ban et al. ................. 365/185.2 |
| 2002/0015439 | A1 | 2/2002 | Kohli et al. |
| 2002/0097430 | A1 | 7/2002 | Curry |
| 2002/0105821 | A1 | 8/2002 | Gray |
| 2002/0126314 | A1 | 9/2002 | Davidson et al. |
| 2002/0146065 | A1 | 10/2002 | Kohli et al. |
| 2002/0150150 | A1 | 10/2002 | Kohli et al. |
| 2003/0021149 | A1 | 1/2003 | So et al. |
| 2003/0058728 | A1 | 3/2003 | Van Tran et al. |
| 2003/0103398 | A1 | 6/2003 | Van Tran |
| 2003/0103400 | A1 | 6/2003 | Van Tran |
| 2003/0103406 | A1 | 6/2003 | Van Tran |
| 2003/0139011 | A1 | 7/2003 | Cleeves et al. |
| 2003/0161183 | A1 | 8/2003 | Van Tran |
| 2003/0200418 | A1 | 10/2003 | DeHon et al. |
| 2004/0026745 | A1 | 2/2004 | Itoh et al. |
| 2004/0037472 | A1 | 2/2004 | Curry |
| 2004/0085185 | A1 | 5/2004 | Waggamon et al. |
| 2004/0088502 | A1 | 5/2004 | Frayer |
| 2004/0130924 | A1 | 7/2004 | Ma et al. |
| 2004/0136446 | A1 | 7/2004 | Kohli et al. |
| 2004/0150710 | A1 | 8/2004 | Sanger et al. |
| 2004/0160797 | A1 | 8/2004 | Van Tran et al. |
| 2004/0178404 | A1 | 9/2004 | Ovshinsky |
| 2004/0186970 | A1 | 9/2004 | Kekre et al. |
| 2004/0202235 | A1 | 10/2004 | Kohli et al. |
| 2005/0002236 | A1 | 1/2005 | Morikawa et al. |

(Continued)

Primary Examiner—Ly D Pham
(74) Attorney, Agent, or Firm—Ido Tuchman (57) ABSTRACT

An operating procedure to provide a cost effective method to maximize the number of levels with respect to a characteristic parameter of a memory cell. The procedures utilize statistical analysis to determine the most likely binary value associated with the characteristic parameter value. In one embodiment, a receiving unit reads the values of the characteristic parameter for each memory cell in the memory cell collection containing a target memory cell. A generating unit generates a probability distribution function of the characteristic parameter for each of the possible binary values for the memory cell collection. The generating unit uses the probability distribution function to determine the probable value range for the shifted value of the characteristic parameter of the target memory cell. The value of the characteristic parameter for the target memory cell is converted into a binary value for which the probability is highest.

18 Claims, 9 Drawing Sheets

U.S. PATENT DOCUMENTS

| | | |
|---|---|---|
| 2005/0037581 A1 | 2/2005 | Hoefler |
| 2005/0169050 A1 | 8/2005 | Itoh et al. |
| 2005/0174844 A1 | 8/2005 | So et al. |
| 2005/0190606 A1 | 9/2005 | Van Houdt et al. |
| 2005/0262389 A1 | 11/2005 | Leijten |
| 2005/0280721 A1 | 12/2005 | van der Heide et al. |
| 2006/0018165 A1 | 1/2006 | Szczypinski |
| 2006/0083042 A1 | 4/2006 | Ma et al. |
| 2006/0091374 A1 | 5/2006 | Yoon et al. |
| 2006/0095826 A1 | 5/2006 | Ruckerbauer et al. |
| 2006/0118774 A1 | 6/2006 | Ovshinsky |
| 2006/0209495 A1 | 9/2006 | Lee et al. |
| 2007/0047318 A1* | 3/2007 | Nagai et al. ............ 365/185.18 |
| 2007/0165460 A1* | 7/2007 | Toki et al. .............. 365/185.22 |

\* cited by examiner

MAXIMUM LIKELIHOOD STATISTICAL METHOD OF OPERATIONS FOR MULTI-BIT SEMICONDUCTOR MEMORY

FIELD OF THE INVENTION

The present invention relates to binary data storage. More specifically, the invention is directed toward a method of storing and retrieving information in a semiconductor computer memory.

BACKGROUND OF THE INVENTION

Typical semiconductor computer memories are fabricated on semiconductor substrates consisting of arrays of large number of physical memory cells. In general, one bit of binary data is represented as a variation of a physical parameter associated with a memory cell. Commonly used physical parameters include threshold voltage variation of the Metal Oxide Field Effect Transistor (MOSFET) due to the amount of charge stored in a floating gate or a trap layer in non-volatile Electrically Erasable Programmable Read Only Memory (EEPROM), resistance variation of the Phase Change memory element in Phase-change Random Access Memory (PRAM) or Ovonic Unified Memory (OUM), and charge storage variation in volatile Dynamic Random Access Memory (DRAM).

Increasing the number of bits to be stored in a single physical semiconductor memory cell is an effective method to lower the manufacturing cost per bit. Multiple bits of data can also be stored in a single memory cell when variations of the physical parameter can be associated with multiple bit values. This multiple bits storage memory cell is commonly known as Multi-Level Cell (MLC). Significant amount of efforts in computer memory device and circuit designs are devoted to maximize the number of bits to be stored in a single physical memory cell. This is particularly true with storage class memory such as popular non-volatile Flash memories commonly used as mass storage device.

The basic requirement for multiple bit storage in a semiconductor memory cell is to have the spectrum of the physical parameter variation to accommodate multiple non-overlapping bands of values. The number of bands required for an n-bit cell is $2^n$. A 2-bit cell needs 4 bands, a 3-bit cell needs 8 bands and so forth. Thus, the available spectrum of a physical parameter in a semiconductor memory cell is the limiting factor for multiple bit memory storage.

In addition to the limiting spectrum width, fluctuations in environmental variables such as temperature, power, and time affect all operations and data integrity of a typical semiconductor storage device. Data integrity is a major problem for data storage systems due to the fluctuations in the environment variables. It is desirable to devise a cost effective method to preserve the integrity of the stored data in semiconductor storage systems.

SUMMARY OF THE INVENTION

One exemplary embodiment of the present invention is a method for operating a memory cell collection. The memory cell collection includes a plurality of memory cells with each memory cell in the memory cell collection storing at least one possible binary value delimited by preset value ranges of a characteristic parameter. Additionally, the value ranges of the characteristic parameter shift over time.

The method for the memory controller operation entails sensing a shifted value of the characteristic parameter for a target memory cell. Another sensing operation senses shifted values of the characteristic parameter for each memory cell in the memory cell collection. A generating operation provides a probability distribution function of the characteristic parameter for each of the possible binary values for each of the possible binary values. The probably distribution function is generated from the shifted values of the characteristic parameter for each memory cell in the memory cell collection. A determining operation determines a probability that the shifted value of the characteristic parameter for the target memory cell is within a probability distribution function. A converting operation converts the shifted value of the characteristic parameter for the target memory cell into a binary value for which the probability is highest.

The embodiment may include programming each memory cell in the memory cell collection by setting the value of the characteristic parameter of the memory cell to an initial reference point. However, in practice, natural variations in manufacturing of memory cells cause the characteristic parameter values stored in the memory cell to form a normal distribution, thus creating a characteristic parameter value range. Additionally, the probability distribution function of the characteristic parameter value can be determined using a maximum likelihood estimator from the shifted values of the characteristic parameter for each memory cell in the memory cell collection.

The characteristic parameter may be charge storage variation in Dynamic Random Access Memory (DRAM), threshold voltage variation in the floating gate in Electrically Erasable Programmable Read Only Memory (EEPROM), resistance variation of Phase Change Memory (PCM), resistance variation of Resistive Random Access Memory (RRAM), or the optical refractive index of the phase change material in optical storage devices.

Another exemplary embodiment of the present invention a memory controller for operating a memory cell collection. The memory cell collection includes a plurality of memory cells, with each memory cell in the memory cell collection storing at least one possible binary value delimited by value ranges of a characteristic parameter. The memory controller includes a receiving unit and a generating unit. The receiving unit receives the values of the characteristic parameter for each memory cell in the memory cell collection. The generating unit generates a probability distribution function of the characteristic parameter for each of the possible binary values for the memory cell collection. The generating unit uses a probability distribution function to determine the probable value range for the shifted value of the characteristic parameter of a target memory cell. Furthermore, the generating unit converts the value of the characteristic parameter for the target memory cell into a binary value for which the probability is highest.

The memory controller may include an analog sense amplifier that converts the analog signals into digital signals representing the characteristic parameter. Additionally, the probable value range of the shifted value of the characteristic parameter of the target memory cell may be generated by a maximum likelihood estimator in the generating unit.

In particular embodiments of the invention, the memory controller is separate from a central processing unit and the memory cell collection. In other embodiments, the memory controller may be packaged within a memory chip containing a plurality of memory cell collections. Thus, yet a further aspect of the invention is a memory chip including a memory cell collection. The memory cell collection includes a plurality of memory cells, and each memory cell in the memory cell collection stores at least one possible binary values delimited by value ranges of a characteristic parameter. The memory chip additionally contains a receiving unit and a generating unit. The receiving unit receives the values of the characteristic parameter for each memory cell in the memory cell collection. The generating unit generates a probability distribution function of the characteristic parameter for each of the possible binary values for the memory cell collection. The generating unit uses a probability distribution function to determine the probable value range for the shifted value of the characteristic parameter of a target memory cell. Furthermore, the generating unit converts the value of the characteristic parameter for the target memory cell into a binary value for which the probability is highest.

Another exemplary embodiment of the invention is a computer program. The computer program includes a tangible computer readable medium embodying computer program code for operating a memory cell collection. The memory cell collection contains a plurality of memory cells, with each memory cell in the memory cell collection storing at least one possible binary values delimited by preset value ranges of a characteristic parameter. The value ranges of the characteristic parameter shift over time. The computer program code includes executable instructions configured for receiving a shifted value of the characteristic parameter for a target memory cell, receiving shifted values of the characteristic parameter for each memory cell in the memory cell collection, generating for each of the possible binary values a probability distribution function of the characteristic parameter from the shifted values of the characteristic parameter, for each of the possible binary values determining a probability that the shifted value of the characteristic parameter for the target memory cell is within its value range, and converting the shifted value of the characteristic parameter for the target memory cell into a binary value for which the probability is highest.

BRIEF DESCRIPTION OF THE SEVERAL VIEWS OF THE DRAWINGS

The invention herein described, by way of example only, with reference to the accompanying drawings, wherein.

DETAILED DESCRIPTION OF THE INVENTION

The present invention will be described with reference to FIGS. 1-9. When referring to the figures, like structures shown throughout are indicated with like reference numerals.

Figure 1:
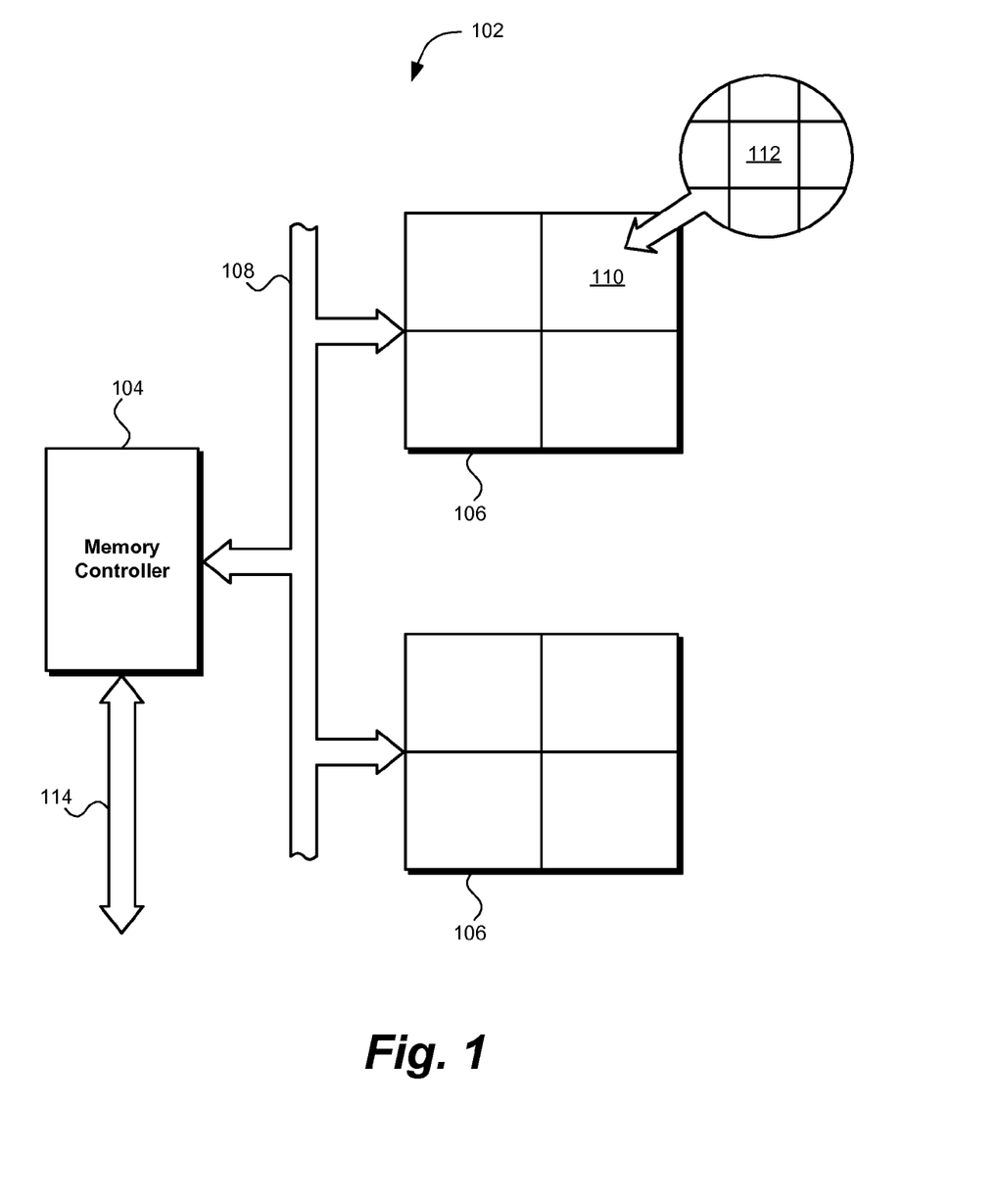
FIG. 1 illustrates an exemplary embodiment for a system operating a plurality of memory cells, memory cell collections, and memory units.

FIG. 1 illustrates an exemplary embodiment for a system 102 contemplated by the present invention. The system 102 includes a memory controller 104 coupled to one or more memory units 106 via a memory bus 108.

The memory units 106 may be individually packaged memory chips. Alternatively, the memory units 106 may exist in a single package and multiplexed together. Furthermore, the memory controller 104 may be separately packaged or incorporated with the memory units 106.

The memory units 106 are not limited to a particular memory storage technology. Those skilled in the art will recognize that different memory technologies use different characteristic parameters to store data. For example, Random Access Memory (DRAM) technology uses charge storage variation as a characteristic parameter to retain binary data. Phase Change Memory (PCM) and Resistive Random Access Memory (RRAM) technology use resistance variation as a characteristic parameter to store binary data.

As shown, each memory unit 106 is divided into a plurality of memory cell collections 110. Each memory cell collection 110 is comprised of a plurality of memory cells 112. Moreover, each individual memory cell 112 contains at least one possible binary value initially delimited by preset value ranges of a characteristic parameter. As discussed above, the characteristic parameter can be, but not limited to, charge storage variation in DRAM, threshold voltage variation in the floating gate of Electrically Erasable Programmable Read Only Memory (EEPROM), optical refractive index of optical memory (CD's, DVD's), and resistance variation (PCM and RRAM).

As discussed in more detail below, the memory controller 104 is configured to operate the memory units 106. The memory controller beneficially compensates for shifts in characteristic parameter values over time by not only reading the characteristic parameter value of a target memory cell 112, but also of the memory cell collection 110 containing the target memory cell 112.

The memory cells within the cell collection 110 are physically located proximate the target cell 112 and therefore undergo similar characteristic parameter deterioration. In one embodiment, the memory controller 104 receives an analog value of the characteristic parameter for the target memory cell 112 via the memory bus 108. The memory controller 104 also senses the characteristic parameter values from the memory cell collection 110. The memory controller 104 then compares the characteristic parameter value of the target memory cell 112 against the characteristic parameter value of the memory cell collection 110. Using statistical analysis, the memory controller 104 determines the binary value most likely stored in the target memory cell 112.

It is understood that the memory controller 104 may interface with electronic devices using various techniques known to those skilled in the art. The binary data determined by the memory controller 104 may, for example, be output to a central data bus 114 in a computer system. The data bus 114 may also deliver binary data to the memory controller 104 for recordation in the memory units 106.

Programming a target memory cell 112 in the system 102 involves statistical operations performed by the memory controller 104. In one embodiment, the memory controller 104 receives data from the central data bus 114. This data includes an indication of one or more target memory cells 112 requiring programming and the binary value the target memory cell 112 needs to store.

In response, the memory controller 104 programs the target memory cell 112 to the desired binary value by setting the characteristic parameter of the cell to a predetermined value. For example, the memory controller may correlate a binary value of 01 to a characteristic parameter value of 200 electrons stored in a target cell's floating gate.

Once the target cell 112 is programmed, the memory controller 104 also programs all the memory cells in the memory cell collection 110 containing the target memory cell 112. Using the same statistical analysis technique for reading the target cell 112, the controller 104 reads all the memory cells in the memory cell collection 110 and determines the binary values stored therein. The memory controller 104 then reprograms each memory cell to the predetermined characteristic parameter value corresponding to the binary value read. In this manner, both the target cell 112 and the entire memory cell collection 110 that the target cell 112 belongs to are programmed at approximately the same time. By programming all cells in a memory collection 110 at once, the parasitic effects at each cell can be compensated for using the statistical techniques described below. It is contemplated that other embodiments of the invention may program the memory cell collection 110 prior to programming the target memory cell 112.

Figure 2:
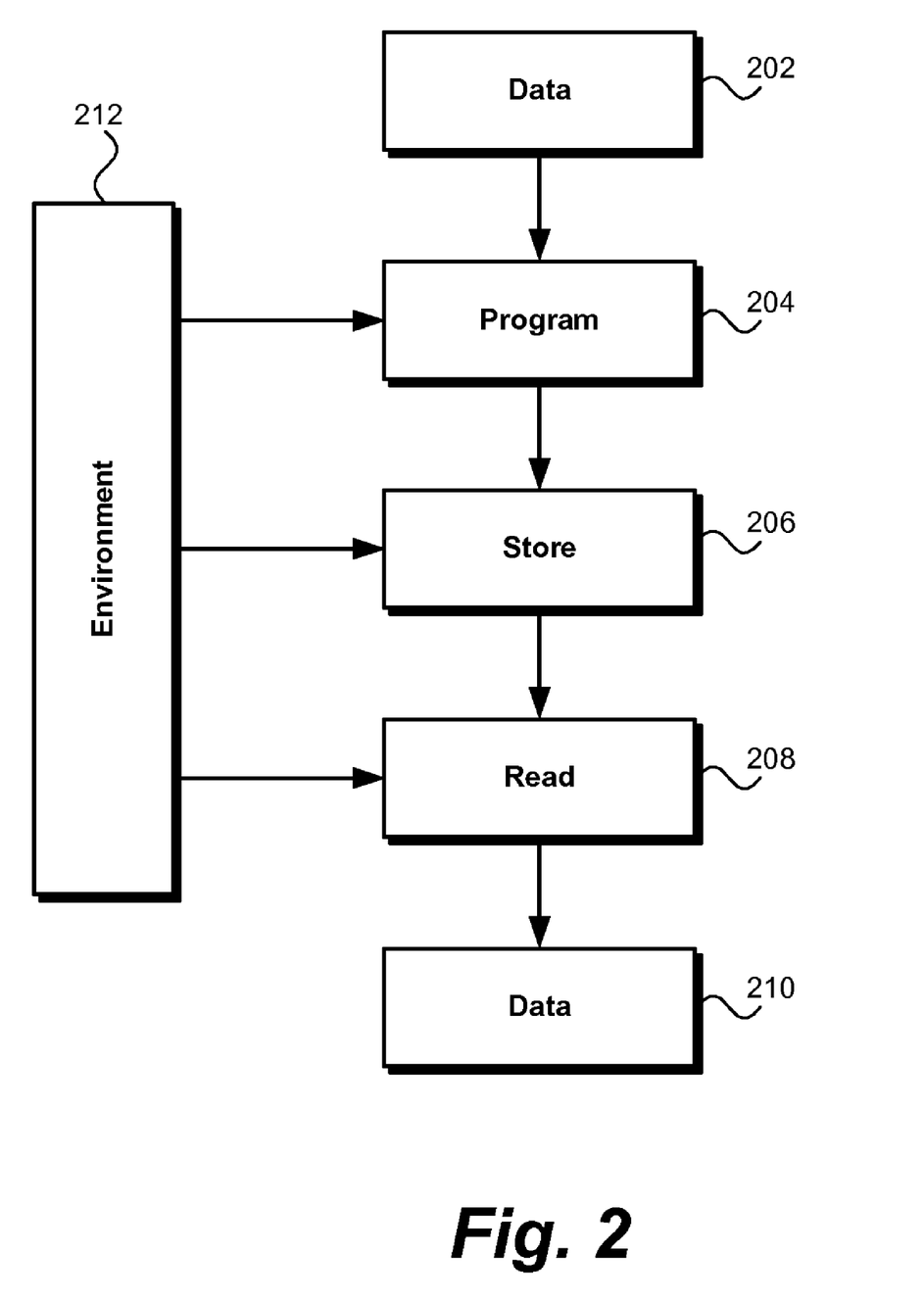
FIG. 2 is a flow chart illustrating the environmental effects on data programming, storage, and retrieval in memory operation.

FIG. 2 shows, in general, the procedure for storing and retrieving data in a memory cell according to the present invention. At step 202, data to be stored is acquired. The data 202 may come from various sources, such as a Central Processing Unit (CPU) or a peripheral device coupled to the memory unit containing the memory cell.

At programming operation 204, the acquired data is written into the memory cell. Depending on the storage technology used, writing data may consist of storing charge in a capacitor for charge storage, applying voltage to the source, drain, or control gate in a floating gate transistor for threshold voltage variation, melting and cooling the phase change material to change optical refractive index, or melting and cooling phase change material to change resistance. After the data is written into memory, it is stored for a period of time at storing operation 206.

At some time in the future, the data is retrieved from the memory cell during reading operation 208. The exact process for retrieving the data again depends on the technology used. For example, when reading DRAM memory, transistors are activated connecting the memory cell capacitors to sense lines. When reading a PCM memory cell, a non-amorphizing/crystallizing current is passed through the cell's phase-change material. The data is finally retrieved at step 210.

As illustrated, the environment 212 (both internal and external to the memory cell) affects the programming 204, storage 206, and reading 208 of the data. Environmental factors such as, but not limited to, humidity, time, temperature, magnetic fields, and electrical fields may cause charge leakage in DRAM, threshold voltage shifts in EEPROM, changes in optical refractive index in phase change material of optical memory, or change the resistance levels in PCM and RRAM. More generally, the characteristic parameter used to delineate binary values in the memory cell may shift over time due to environmental conditions. The environmental factors 212 cause data distortion so that the data extracted from the memory cell may not be the same as the data input to the memory cell. As discussed below, an embodiment of the present invention is an operating procedure that compensates for shifts in the characteristic parameter over time. By doing so, the storage density of memory cells can be increased.

Figure 3:
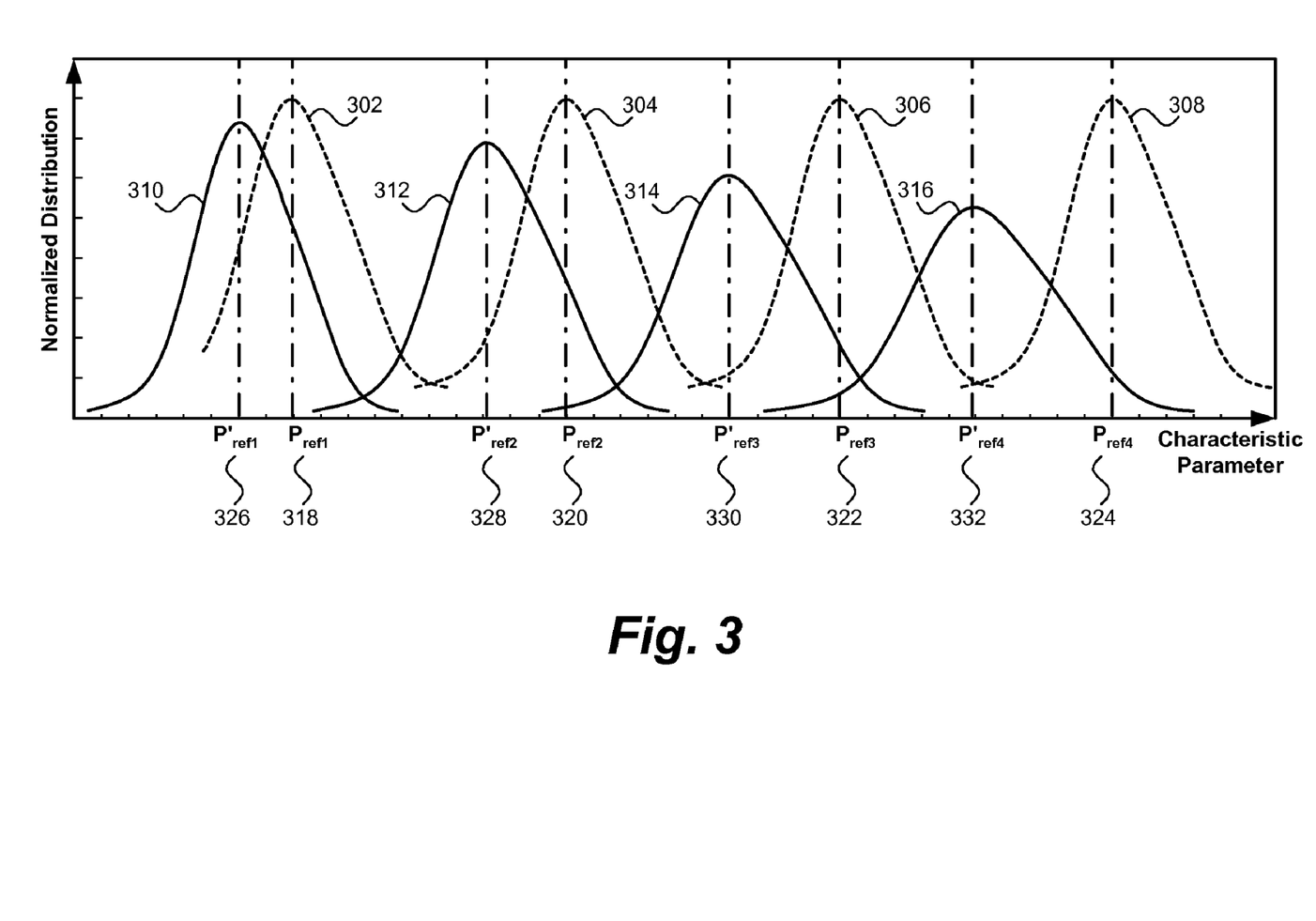
FIG. 3 illustrates the characteristic parameter value ranges and reference points prior to the characteristic parameter value shifts and after the shifts.

Turning now to FIG. 3, a representation of a characteristic parameter shift in a memory cell collection is shown. Ideally, binary values stored in the memory cell collection are represented by precise characteristic parameter values 318, 320, 322, 324. In practice, however, the characteristic parameter values form value ranges 302, 304, 306, 308 (typically Gaussian distribution curves) centered around the initial reference points 318, 320, 322, 324. This is typically due to natural variations during memory cell manufacturing. Thus, the initial reference points 318, 320, 322, 324 are mean values of the characteristic parameter when data is initially programmed in a memory cell collection. The value ranges and reference points correspond to binary values of data. For example, value range 302 and reference point 318 may correspond to binary value 00, value range 304 and reference point 320 may correspond to binary value 01, value range 306 and reference point 322 may correspond to binary value 10, and value range 310 and reference point 324 may correspond to binary value 11.

Furthermore, the characteristic parameter values shift as a result of environmental factors over time, as discussed above. Thus, shifted value ranges 310, 312, 314, 316 represent the characteristic parameter value ranges shifted over time from the initial value ranges 302, 304, 306, 308. The shifted value ranges 310, 312, 314, 316 are centered about the shifted reference points 326, 328, 330, 332. For example, value range 310 represents binary data that initial value range 302 formerly represented, value range 312 represents binary data that initial value range 304 once represented, and so on.

As described below, a memory controller according to the present invention constructs the shifted characteristic parameter curves 310, 312, 314, 316 based on a memory cell collection proximate a target memory cell to be read. The characteristic parameter value of the target cell is compared against the shifted characteristic parameter curves 310, 312, 314, 316 constructed, and the most likely binary value for the target memory cell is determined. In one embodiment of the invention, the shifted characteristic parameter curves 310, 312, 314, 316 of the memory cell collection are reconstructed each time the target memory cell or a memory cell block is read. It is contemplated that other embodiments of the invention may reconstruct the parameter curves 310, 312, 314, 316 after a threshold time interval has expired since the last curve construction. This entails that the data should be rewritten after a threshold time interval and/or when a memory cell is programmed or reprogrammed.

As discussed above, time, heat, and other environmental factors shift characteristic parameter values and their ranges. Over a period of time the value ranges shift enough so that they may become one continuous curve. For example, the shifted value ranges 310, 312, 314, 316 do not exhibit large areas of overlap, yet it is quite evident that given enough time the value ranges will significantly overlap. While a maximum likelihood estimator can be used to generate a good estimate for values located in an overlapping region, as overlap increases the accuracy of the maximum likelihood estimator decreases.

Deleterious overlap in value ranges are prevented by reconstructing and rewriting the shifted value ranges 310, 312, 314, 316 and their corresponding reference points 326, 328, 330, 332. This is achieved by reprogramming cells in a memory cell collection with the initial characteristic parameter values written prior to the shift. Thus, the shifted reference points 326, 328, 330, 332 are essentially set back to the initial reference points 318, 320, 322, 324, respectively. In this manner the curves are returned to minimal overlap and data is better retained within the memory cells. The logical operations of this process are discussed below.

In one embodiment of the invention, the characteristic parameter curves are created by a probability distribution function, $$P(x_1^k, \ldots, x_{n_k}^k | \mu_k, \sigma_k^2) = \left(\frac{1}{2\pi\sigma_k^2}\right)^{\frac{n_k}{2}} e^{-\frac{\sum_{i=1}^{n_k}(x_i^k - \overline{x^k})^2 + n_k(\overline{x^k} - \mu_k)^2}{2\sigma_k^2}}$$

where $n_k$ is the number of memory cells with a characteristic parameter in the kth value range, m is the number of bit storage values per memory cell, and $x^k$ is the value of the characteristic parameter value read from a memory cell pertaining to a specific curve, not x to the kth power; so, $x_1^1$ would indicate the first characteristic parameter from the first characteristic parameter value range in the memory cell collection. The number of value ranges/curves (k) and the mean of the characteristic parameter values read ($\overline{x^k}$) are defined by, $$k = 1, \ldots, 2^m, \overline{x^k} = \frac{1}{n_k}\sum_{i=1}^{n_k} x_i^k.$$

Additionally, $\mu_k$ is the mean of the kth value range, also used as the reference points in FIG. 3, and $\sigma_k^2$ is the variance of the kth value range.

A maximum likelihood estimator is given by, $$\hat{\theta}_k = (\hat{\mu}_k, \hat{\sigma}_k^2) = \left(\overline{x^k}, \sum_{i=1}^{n_k}(x_i^k - \overline{x^k})^2 / n_k\right)$$

where $\hat{\mu}_k$ is the mean estimator of the kth value range and $\hat{\sigma}_k^2$ is the variance estimator of the kth value range. The maximum likelihood estimator is used to determine the value range to which a particular value belongs, and in turn the binary data a memory cell contains, by using the least squares method. The sensed value from the memory cell is placed in each individual value range of the memory cell collection and a probability is assigned to each value range based on the value and its relation to the mean of the value range.

A problem in constructing new distribution curves arises if each individual memory cell is programmed separately. The shifts of each characteristic parameter will vary since each memory cell may be exposed to environmental factors over different durations of time between programming. For example, in EEPROM, the electrons stored in the floating gate may leak as a result of time and heat. Memory cells programmed at differing times will have differing amounts of electron leakage depending on the duration of environmental exposure subsequent to initial programming. Furthermore, the characteristic parameter curves may differ greatly from memory cell collection to memory cell collection.

Memory cell collections programmed in their entirety, regardless of the number of memory cells requiring programming, allow for consistent data shift across the memory cell collection. This prevents the aforementioned problems with varying amounts of characteristic parameter value shifts from memory cell to memory cell in a single memory cell collection. New distribution curves can now be created with consistently shifted data using the probability distribution function and the maximum likelihood estimator.

Figure 4:
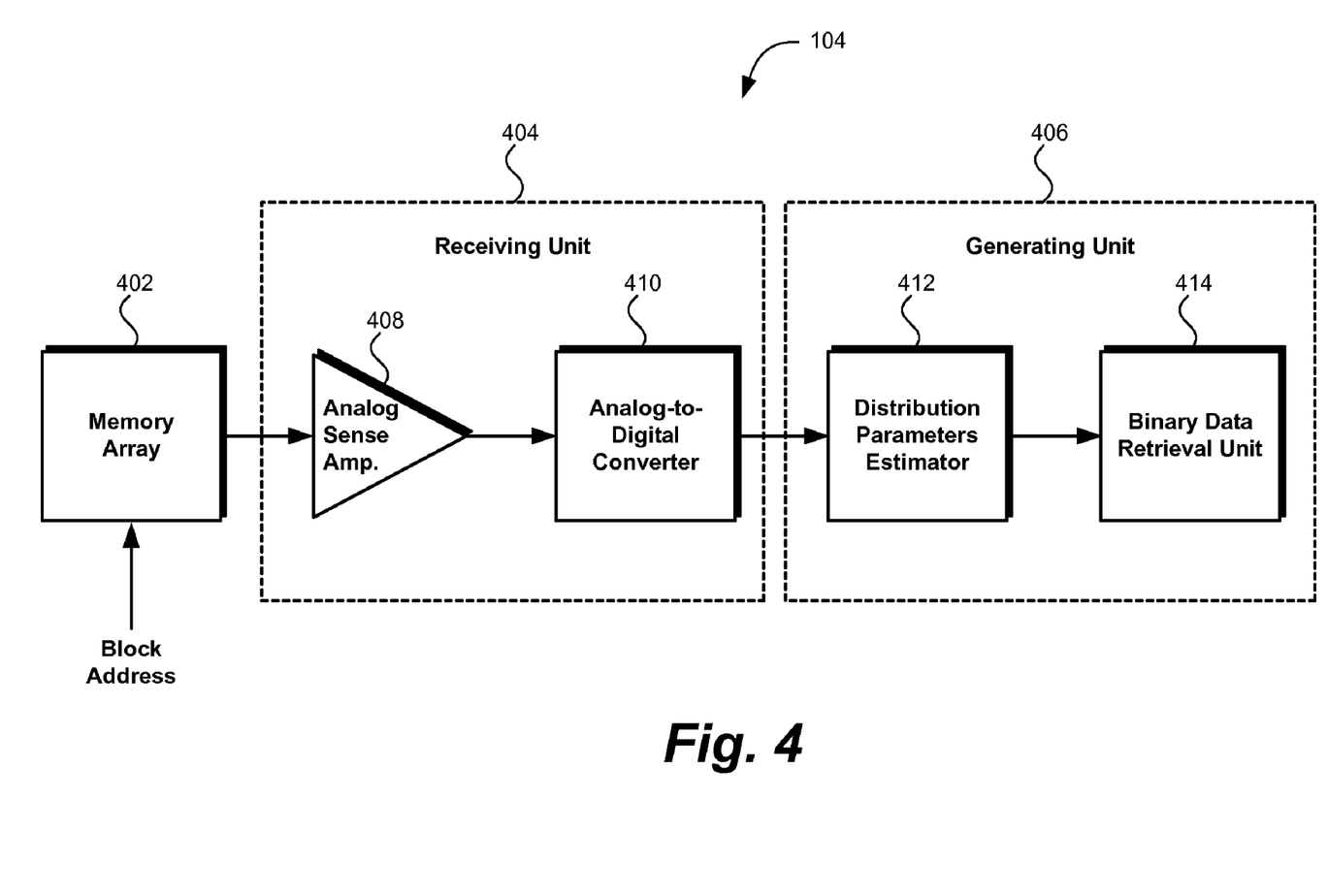
FIG. 4 illustrates a memory controller utilized for operation of the memory system.

FIG. 4 shows an exemplary memory controller 104 for operating a memory cell in accordance with the present invention. The memory controller 104 includes a receiving unit 404 and a generating unit 406. The receiving unit 404 receives the values of the characteristic parameter for each memory cell in a memory array 402. The memory cells examined by the receiving unit 404 may, for example, be addressed using a block address input to the memory array 402. The generating unit 406 is coupled to the receiving unit 404 and is configured to generating a probability distribution function of the characteristic parameter for each of the possible binary values for a memory array 402.

More specifically, data is accessed by locating the block address of a memory array 402 containing the data desired. The raw data is read as an analog signal by an analog sense amplifier 408. The analog sense amplifier 408 amplifies the signal and sends the signal to an analog-to-digital converter 410. The analog-to-digital converter 410 converts the analog signal to digital data that can be read and processed by the generating unit 406. In one embodiment of the invention, the resolution of the analog-to-digital converter 410 is a multiple of the number of bits stored in each memory cell. For example, the resolution of the analog-to-digital converter 410 may have a resolution three times the number of bits stored per memory cell. For a memory cell storing two bits, the resolution would therefore equal six bits.

A distribution parameters estimator 412 in the generating unit 406 creates the normal distribution curves for the memory block with the probability distribution function. The mean and variance of these distribution curves are also calculated by the distribution parameters estimator 412. A binary data retrieval unit 414, coupled to the parameters estimator 412, converts the value of the characteristic parameter for the target memory cell into a binary value for which the probability is highest.

Figure 5:
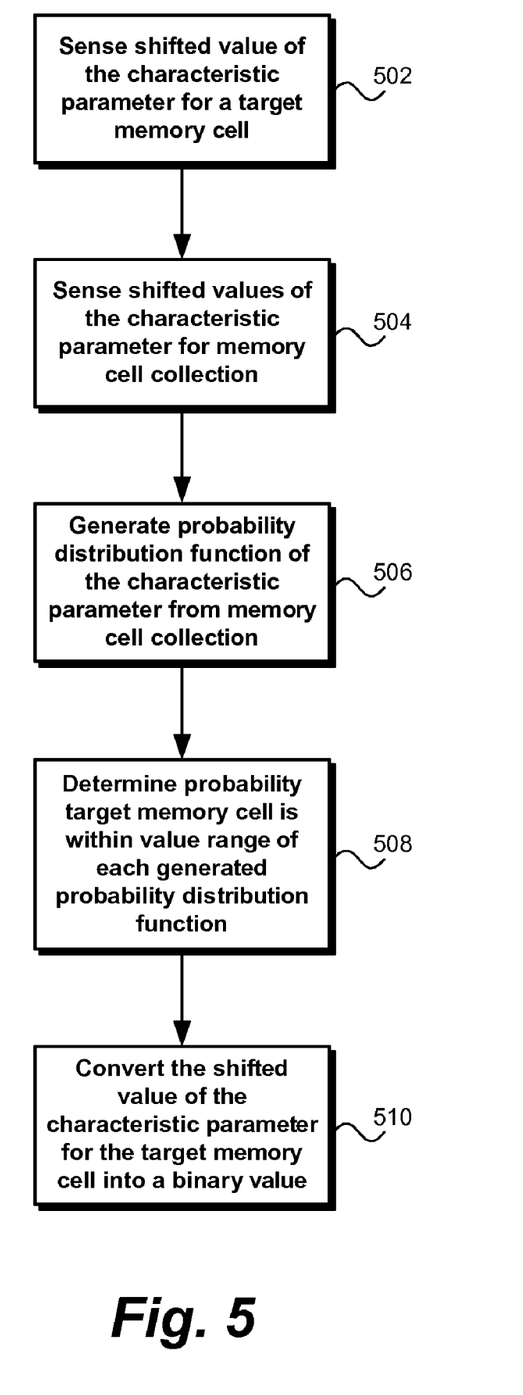
FIG. 5 is a flow chart of the logical operations involved in reading data from the memory system.

FIG. 5 shows a flow chart for operating a memory cell collection contemplated by an embodiment of the present invention. It should be remarked that the logical operations shown may be implemented with an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, electromagnetic, infrared, or semiconductor system, apparatus or device. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device or a magnetic storage device.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages.

At sensing operation 502 a shifted value of the characteristic parameter for a target memory cell is received. In other words, the characteristic parameter value of the target memory cell is read. An example of this would be to use an electrical current of non-amorphizing/crystallizing voltage to detect the resistance of a PCM cell. After sensing operation 502 is completed, control passes to sensing operation 504.

At sensing operation 504, the shifted values of the characteristic parameter for each memory cell in the memory cell collection are received. As discussed above, the shifted values are a result of parasitic factors that change the characteristic parameter over time. It is contemplated that the memory cell collection sensed during sensing operation 504 contains a large enough number of memory cells so that accurate characteristic parameter curves for all binary values can be generated. In one embodiment of the invention, the number of cells in the memory cell collection is 1028 cells. It is contemplated that many other numbers of cells may be used to define a cell collection. After sensing operation 504 is completed, process flow moves to generating operation 506.

At generating operation 506, a probability distribution function of the characteristic parameter is generated for each of the possible binary values the memory cells are capable of storing. The mean and variance of the shifted values are also extracted from the probability distribution function. In a particular embodiment of the invention, the probability distribution functions are obtained from the sensed analog signals of each memory cell during sensing operation 504. Since, as discussed above, all memory cells in the memory cell collection are programmed at the same time, the probability distribution functions reflect characteristic parameter shift for all memory cells during the same time interval since initial programming. After generating operation 506 is completed, control passes to determining operation 508.

At determining operation 508, a probability that the shifted value of the characteristic parameter for the target memory cell is within the value range of each generated probability distribution function is calculated using a maximum likelihood estimator and the mean and variance of the shifted values. Thus, the analog data sensed from the target memory cell at sensing operation 502 is compared to the value ranges of the probability distribution functions constructed at generating operation 506. Once determining operation 508 is completed, control passes to converting operation 510.

At converting operation 510, the shifted value of the characteristic parameter for the target memory cell is converted into a binary value for which the probability calculated during determining operation 508 is highest. The memory controller outputs the binary value to the data bus or other circuits requesting the binary value.

Figure 6:
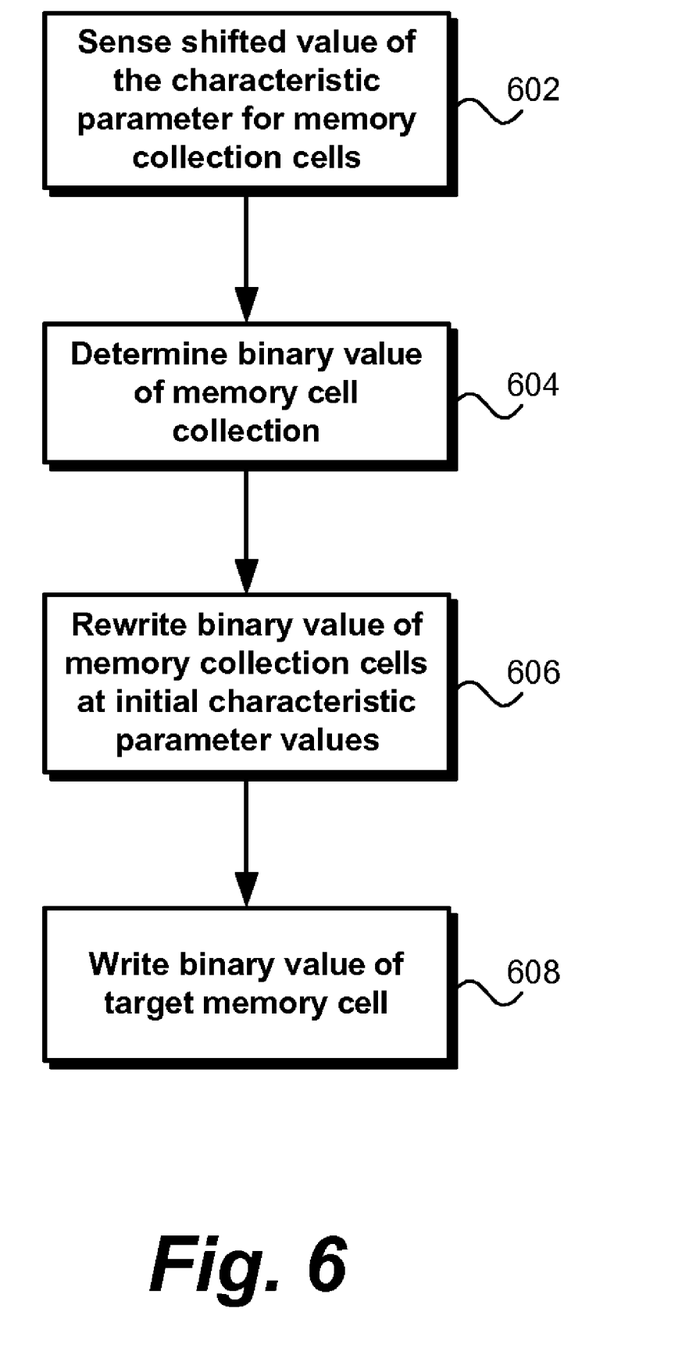
FIG. 6 is a flow chart of the logical operations involved in writing data to the memory system.

The flow chart illustrated in FIG. 6 details operations performed by an exemplary memory controller in programming data to a target memory cell in a memory cell collection. Again, these logical operations may be implemented in an entirely hardware embodiment, an entirely software embodiment, or an embodiment combining hardware and software.

Programming a target memory cell begins with sensing operation 602. During this operation, shifted values of the characteristic parameter are detected for each memory cell in the memory collection containing the target memory cell. As described above, sensing shifted characteristic parameter values can be performed by reading an analog signal from an analog sense amplifier electrically coupled to each cell in the memory collection. An analog-to-digital converter can be used to convert the analog signal to digital data. After sensing operation 602 is completed, control passes to determining operation 604.

At determining operation 604, the binary values stored by each cell in the memory cell collection is determined using the statistical analysis described above. Briefly, probability distribution functions of the shifted characteristic parameter are generated for each possible binary value in the memory cell collection. The probability that the shifted characteristic parameter of each cell in the memory cell collection is within each function is calculated. Finally, the binary value corresponding to the probability distribution function is assigned to the memory cell. After determining operation 604 is completed, control passes to rewriting operation 606.

At rewriting operation 606, the binary values computed at determining operation 604 are programmed back to the cell in the memory cell collection. During this step, the characteristic parameter of each cell is essentially restored to its predetermined value. Consider, for instance, a cell initially programmed with 200electrons in its floating gate to store binary value 01. Over time electron charge may have degraded to 175 electrons. Determining operation 604 calculates, based on the memory cell collection, that a characteristic parameter value of 175 electrons corresponds to binary value 01. Rewriting operation 606 uses this information to reprogram the memory cell back to its initial charge of 200 electrons.

It is contemplated that rewriting operation 606 may be performed all at once after all binary values are determined at operation 604. Alternatively, the sensing operation 602, determining operation 604, and rewriting operation 606 may be performed recursively for each cell as the memory controller steps through the memory cell collection.

At writing operation 608, the target memory cell is programmed to the predetermined characteristic parameter value corresponding to the binary value assigned to the cell. It is contemplated that the writing operation 608 may be performed before sensing operation 602.

Figure 7:
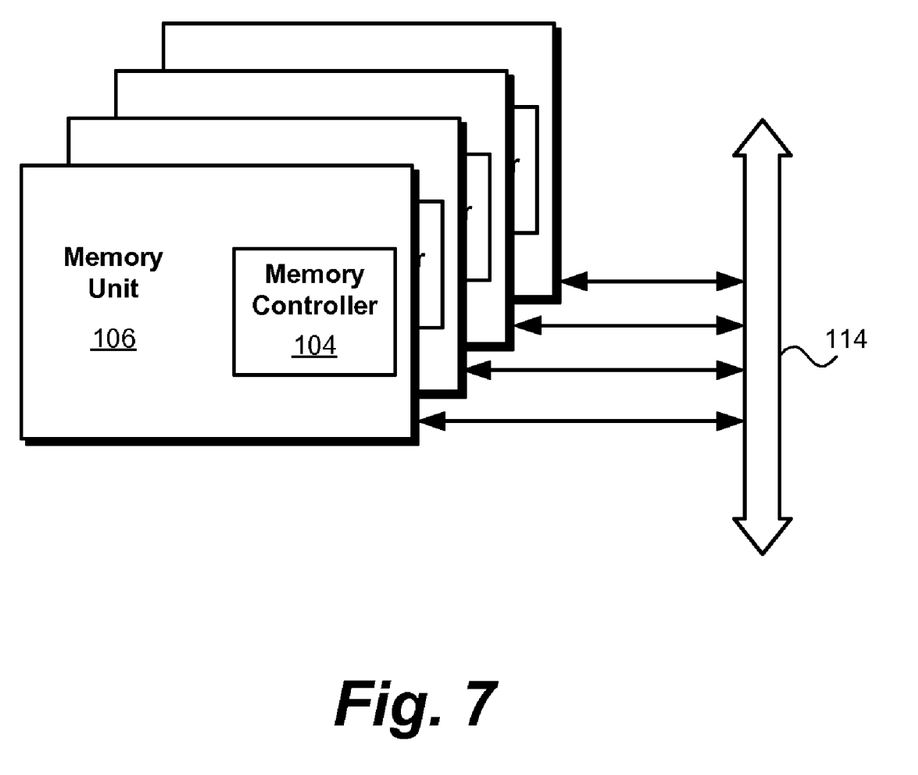
FIG. 7 illustrates an embodiment of a memory system where a memory controller is packaged with each memory unit.

FIG. 7 illustrates an embodiment of a memory system contemplated by the present invention where the memory controller 104 is incorporated into individual memory units 106. In this embodiment, each memory unit 106 includes its own memory controller 104. Thus, the processing of data (converting the data, generating the curves, retrieving the binary data) is performed independently at each memory unit 106. Each memory unit 106 sends the binary data to the data bus 114 which can send the binary data to the central processing unit (not shown). It is contemplated the memory controllers 104 are capable of performing handshaking or are otherwise configured to avoid writing data to the data bus 114 at the same time.

Figure 8:
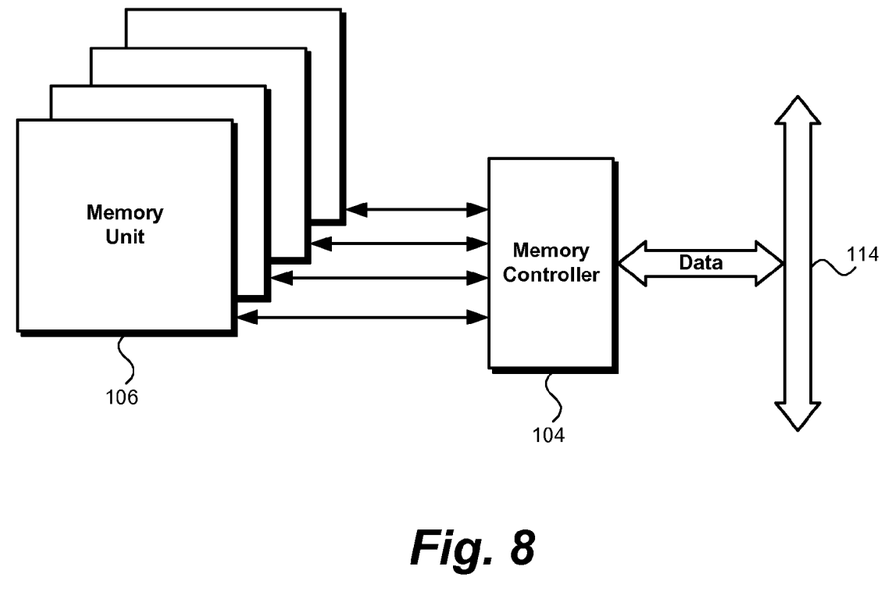
FIG. 8 illustrates an embodiment of a memory system where a memory controller is located outside of each individual memory unit and operates all the memory units in the system.

FIG. 8 shows another embodiment of a memory system contemplated by the present invention. In this embodiment, the memory controller 104 is located outside of the memory units 106. Analog values sensed in the memory units 106 are sent to the central memory controller 104. The memory controller 104 processes the data (converting the data, generating the curves, retrieving the binary data) as discussed above. The memory controller 104 further sends the binary data to a data bus 114 that can transfer the data to a central processing unit (not shown).

It is contemplated that the memory controller may be embodied as an embedded computer. Some of the elements of such a computer are presented in FIG. 9, wherein a processor 902 is shown having an input/output (I/O) unit 904, a central processing unit (CPU) 908, and a main memory unit 908. The main memory unit 908 generally stores program instructions and data used by the processor 902. Instructions and instruction sequences implementing the present invention may, for example, be embodied in memory 908. Various types of memory technologies may be utilized in the main memory unit 908, such as Random Access Memory (RAM), Read Only Memory (ROM), and Flash memory.

Figure 9:
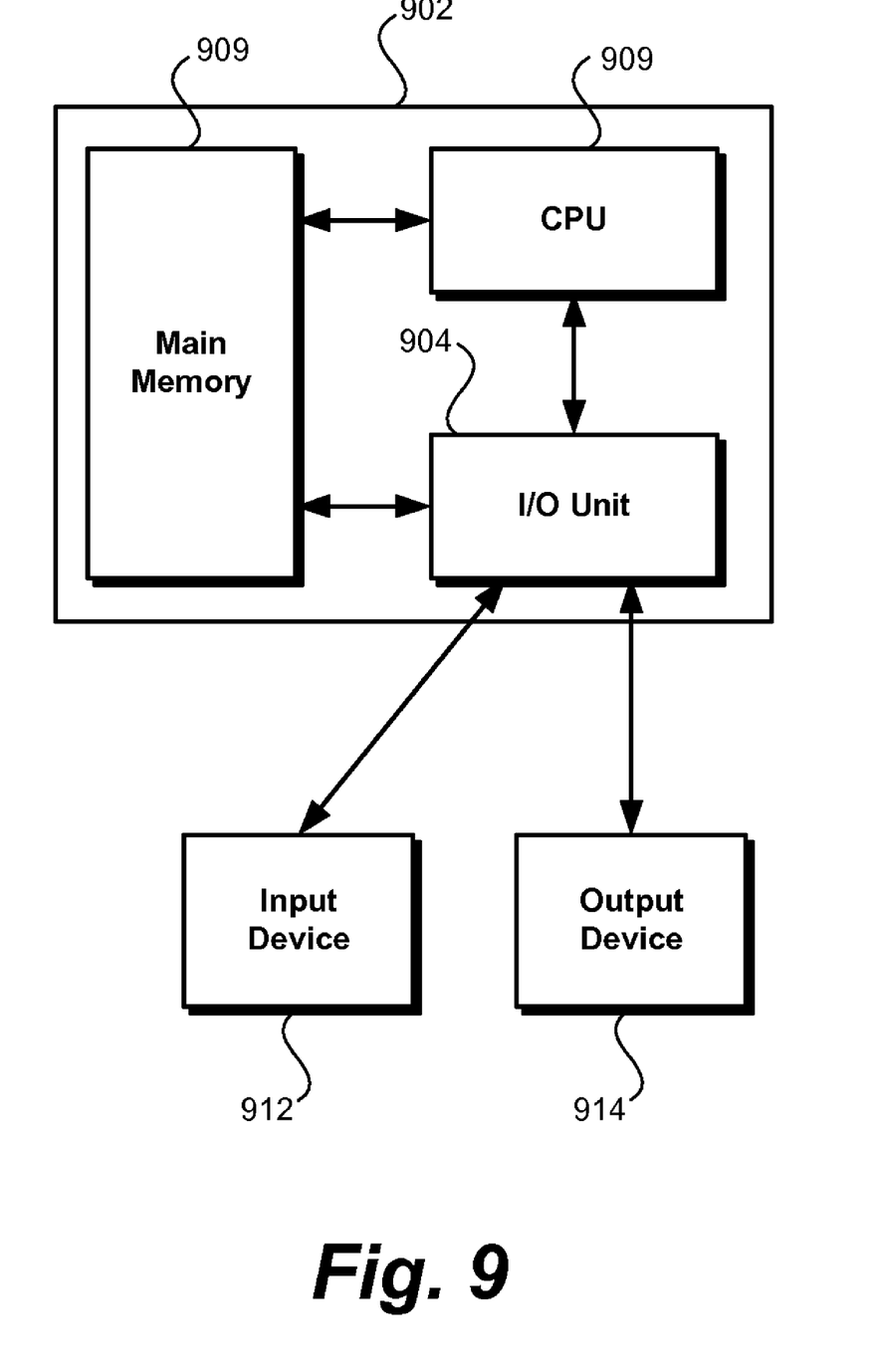
FIG. 9 illustrates typical elements of an embodiment where a memory controller is contained in a software product.

The I/O unit 904 connects with an input device unit 912 and an output device unit 914. The input device unit 912 may include input hardware such as an analog-to-digital converter. The output device unit 914 may be output hardware such as data buffer. Arrows in FIG. 9 represent the system bus architecture of the computer, however, these arrows are for illustrative purposes only.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to embodiments thereof, it will be apparent that modifications and variations are possible without departing from the scope of the invention defined in the appended claims.

That which is claimed is:

1. A method for operating a memory cell collection, the memory cell collection including a plurality of memory cells, each memory cell in the memory cell collection storing at least two possible binary values delimited by preset value ranges of a characteristic parameter, wherein the value ranges of the characteristic parameter shift over time, the method comprising:
   sensing a shifted value of the characteristic parameter for a target memory cell;
   sensing shifted values of the characteristic parameter for each memory cell in the memory cell collection;
   generating a probability distribution function of the characteristic parameter for each of the possible binary values from the shifted values of the characteristic parameter for each memory cell in the memory cell collection;
   for each of the possible binary values, determining a probability that the shifted value of the characteristic parameter for the target memory cell is within its probability distribution function; and
   converting the shifted value of the characteristic parameter for the target memory cell into a binary value for which the probability is highest.

2. The method of claim 1, further comprising programming each memory cell in the memory cell collection by setting the value of the characteristic parameter of the memory cell to a center of the preset value range for one of the possible binary values.

3. The method of claim 1, wherein each of the probability distribution function of the characteristic parameter is determined using maximum likelihood estimation from the shifted values of the characteristic parameter for each memory cell in the memory cell collection.

4. The method of claim 1, wherein the characteristic parameter is charge storage variation in Dynamic Random Access Memory (DRAM).

5. The method of claim 1, wherein the characteristic parameter is threshold voltage variation in the floating gate in Electrically Erasable Programmable Read Only Memory (EEPROM).

6. The method of claim 1, wherein the characteristic parameter is resistance variation of Phase Change Memory (PCM).

7. The method of claim 1, wherein the characteristic parameter is resistance variation of Resistive Random Access Memory (RRAM).

8. The method of claim 1, wherein the characteristic parameter is the optical refractive index of optical storage devices.

9. A memory controller for operating a memory cell collection, the memory cell collection including a plurality of memory cells, each memory cell in the memory cell collection storing at least one possible binary value delimited by value ranges of a characteristic parameter, the method comprising:
   a receiving unit for receiving values of the characteristic parameter for each memory cell in the memory cell collection; and
   a generating unit for generating a probability distribution function of the characteristic parameter for each of the possible binary values for the memory cell collection, the generating unit using the probability distribution function to determine the probable value range for a shifted value of the characteristic parameter of a target memory cell, and the generating unit converting the value of the characteristic parameter for the target memory cell into a binary value for which the probability is highest.

10. The memory controller of claim 9, wherein the memory controller is separate from the central processing unit and the memory cell collection.

11. The memory controller of claim 9, wherein the receiving unit is comprised of an analog sense amplifier which converts the analog signals into digital signals representing the characteristic parameter.

12. The memory controller of claim 9, wherein the probable value range of the shifted value of the characteristic parameter of the target memory cell is generated by a maximum likelihood estimator.

13. A memory chip comprising:
   a memory cell collection including a plurality of memory cells, each memory cell in the memory cell collection storing at least two possible binary values delimited by value ranges of a characteristic parameter;
   a receiving unit for receiving values of the characteristic parameter for each memory cell in the memory cell collection;
   a generating unit for generating a probability distribution function of the characteristic parameter for each of the possible binary values for the memory cell collection, the generating unit using the probability distribution function to determine the probable value range for a shifted value of the characteristic parameter of a target memory cell, and the generating unit converting the value of the characteristic parameter for the target memory cell into a binary value for which the probability is highest.

14. The memory chip of claim 13, wherein a plurality of memory cell collections is incorporated.

15. The memory chip of claim 13, wherein the receiving unit is comprised of an analog sense amplifier which converts the analog signals into digital signals representing the characteristic parameter.

16. The memory chip of claim 13, wherein the probable value range of the shifted value of the characteristic parameter of the target memory cell is generated by a maximum likelihood estimator.

17. A computer program product comprising a tangible computer readable medium embodying computer program code for operating a memory cell collection, the memory cell collection including a plurality of memory cells, each memory cell in the memory cell collection storing at least one possible binary values delimited by preset value ranges of a characteristic parameter, wherein the value ranges of the characteristic parameter shift over time, the computer program code comprising computer executable instructions configured for:
- receiving a shifted value of the characteristic parameter for a target memory cell;
- receiving shifted values of the characteristic parameter for each memory cell in the memory cell collection;
- generating for each of the possible binary values a probability distribution function of the characteristic parameter from the shifted values of the characteristic parameter;
- for each of the possible binary values, determining a probability that the shifted value of the characteristic parameter for the target memory cell is within its value range; and
- converting the shifted value of the characteristic parameter for the target memory cell into a binary value for which the probability is highest.

18. The computer program product of claim 17, wherein each of the probability distribution functions of the characteristic parameter is determined using maximum likelihood estimation from the shifted values of the characteristic parameter.

* * * * *